United States Patent
Weaver et al.

(10) Patent No.: US 8,242,006 B2
(45) Date of Patent: Aug. 14, 2012

(54) SMOOTH ELECTRODE AND METHOD OF FABRICATING SAME

(75) Inventors: Stanton Earl Weaver, Northville, NY (US); Stacey Joy Kennerly, Albany, NY (US); Marco Francesco Aimi, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1270 days.

(21) Appl. No.: 11/962,494

(22) Filed: Dec. 21, 2007

(65) Prior Publication Data

US 2012/0080214 A1    Apr. 5, 2012

(51) Int. Cl.
*H01L 21/76* (2006.01)
*H01L 21/44* (2006.01)
*H01L 21/28* (2006.01)
*H01L 21/4763* (2006.01)

(52) U.S. Cl. ........ 438/578; 438/454; 438/579; 438/574; 438/666; 438/758; 257/E21.011; 257/E21.045; 257/E21.061; 257/E21.158; 257/E21.476

(58) Field of Classification Search ........... 257/E21.011, 257/E21.045, E21.061, E21.158, E21.159, 257/E21.476
See application file for complete search history.

(56) References Cited

U.S. PATENT DOCUMENTS

| 7,018,910 | B2 | 3/2006 | Ghyselen et al. |
| 7,470,555 | B2 * | 12/2008 | Matsumura ..................... 438/22 |
| 2002/0053712 | A1 | 5/2002 | Willis |
| 2004/0161943 | A1 * | 8/2004 | Ren et al. ..................... 438/758 |
| 2005/0067633 | A1 | 3/2005 | Mushika |
| 2006/0043599 | A1 | 3/2006 | Akram et al. |
| 2006/0046432 | A1 | 3/2006 | Sankarapillai et al. |

FOREIGN PATENT DOCUMENTS

| EP | 0397462 B1 | 11/1995 |
| EP | 0563992 B1 | 7/1998 |

OTHER PUBLICATIONS

Nguyen et al., "Through-wafer copper electroplating for three-dimensional interconnects", Institute of Physics Publishing, Journal of Micromechanics and Microengineering, vol. 12, pp. 395-399, 2002.
Premachandran et al., "A Novel Electrically Conductive Wafer Through Hole FIlled Vias Interconnect for 3D MEMS Packaging", 2003 Electronic Components and Technology Conference, pp. 627-630, 2003.

* cited by examiner

*Primary Examiner* — Mohsen Ahmadi
(74) *Attorney, Agent, or Firm* — Mary Louise Gioeni (57) ABSTRACT

A smooth electrode is provided. The smooth electrode includes at least one metal layer having thickness greater than about 1 micron; wherein an average surface roughness of the smooth electrode is less than about 10 nm.

6 Claims, 10 Drawing Sheets

SMOOTH ELECTRODE AND METHOD OF FABRICATING SAME

This invention was made with Government support under contract number DE-FC26-04NT42324 awarded by the U.S. Department of Energy. The Government has certain rights in the invention.

BACKGROUND

Embodiments of the invention relate generally to electrodes, and particularly to, methods of fabricating electrodes having determined morphologies.

Various devices using electrodes are known and are in use. As one example, heat transfer devices such as thermotunneling devices employed in heating/cooling systems include electrodes to facilitate tunneling of electrons across such electrodes. Typically, the electrodes are coupled to objects that are desired to be heated/cooled. In operation, a flow of current is provided through electrodes, which are separated by a tunneling gap to facilitate the tunneling of electrons across the tunneling gap. As a result of this tunneling flow of electrons, the thermotunneling device facilitates heat transfer between the objects. To operate a thermotunneling device with a small tunneling gap, it is desirable to provide electrodes having smooth surfaces. Further, certain devices require electrodes having other determined morphologies.

Typically, electrodes used in such devices include thick layers of metals. Unfortunately, it is difficult to fabricate electrodes having determined morphologies. For example, it is difficult to fabricate smooth electrodes with thick metal layers as conventional deposition techniques used for depositing the metal layers increase surface roughness of an underlying substrate. Furthermore, forming electrical feedthroughs using conventional techniques also adds to the surface roughness of the electrodes. In addition, conventional techniques for forming smooth electrodes require relatively expensive and time-consuming processes such as CMP (chemical mechanical polishing).

Accordingly, it would be desirable to provide an electrode having a determined morphology that can be employed for a variety of applications. Furthermore, it would be desirable to provide methods to fabricate such electrode.

BRIEF DESCRIPTION

Briefly, according to one embodiment of the invention, a smooth electrode is provided. The smooth electrode includes at least one metal layer having thickness greater than about 1 micron; wherein an average surface roughness of the smooth electrode is less than about 10 nm.

In another embodiment, a device is provided. The device includes at least one smooth electrode having at least one metal layer of thickness greater than about 1 micron; wherein an average surface roughness of the smooth electrode is less than about 10 nm.

In another embodiment, a method of fabricating an electrode is provided. The method includes bonding a wafer to a metal coated substrate. The method also includes removing the substrate to form the electrode having a determined morphology.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present invention function to provide methods of fabricating electrodes having determined morphology. In particular, embodiments of the present invention provide a technique that facilitates fabrication of smooth and textured electrodes that can be used for a variety of devices such as heat transfer devices, switch contacts and micro-electro-mechanical systems.

As used herein, the term "smooth electrode" refers to an electrode that has an average surface roughness ($R_a$) of less than about 10 nm. Further, the average surface roughness is represented by average height of bumps on the surface of the electrode. It should be noted that other measures of surface roughness may be employed to measure the roughness of the smooth electrode.

Figure 1:
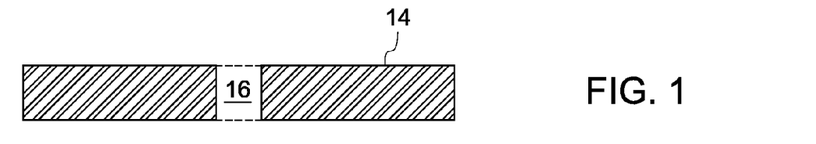
FIGS. 1-5 illustrate an exemplary process for fabricating a smooth electrode.

Referring now to the drawings, FIGS. 1-5 illustrate an exemplary process for fabricating a smooth electrode. In FIG. 1, a wafer 14 having vias such as represented by reference numeral 16 is provided. In this exemplary embodiment, the wafer 14 represents a thermally blocking layer. Examples of the wafer 14 include glass, or silicon dioxide, or sapphire, or silicon carbide, or a combination thereof. In this exemplary embodiment, the thermal blocking layer 14 includes borosilicate glass, such as PYREX having a thermal conductivity of about 1 W/m-K.

Figure 2:
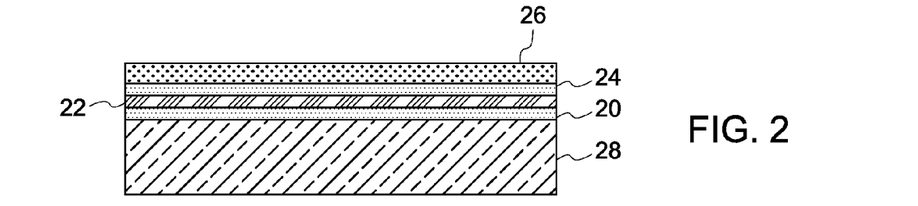

Further, as illustrated in FIG. 2, a plurality of layers having electrically and thermally conductive materials are deposited on a top surface of a substrate 28. In this exemplary embodiment, a plurality of metals such as represented by reference numerals 20, 22, 24 and 26 are deposited on the top surface of the substrate 28. It should be noted that the use of top, bottom, above, below and variations of these terms is made for convenience to describe interrelationships between components, but does not require any particular orientation of the overall structure or assembly. In this exemplary embodiment, four layers of metals are sputtered on the substrate 28. However, a greater or a lesser number of metal layers may be deposited on the substrate 28. Examples of metals 20, 22, 24 and 26 may include tungsten, platinum, copper, molybdenum, titanium, nickel, tantalum, aluminum, chromium, cesium and gold. In this exemplary embodiment, the metals 20 and 24 may include tungsten. Further, the metals 22 and 26 may include platinum and gold respectively. In one exemplary embodiment, a total thickness of the plurality of metals 20, 22, 24 and 26 is about 1 micron. In certain embodiments, each of the plurality of metals 20, 22, 24 and 26 have different thicknesses. In this exemplary embodiment, the substrate 28 includes silicon, or pyrex, or quartz, or mica, or sapphire. In this embodiment, a surface roughness of the substrate 28 is about 10 nm.

Figure 3:
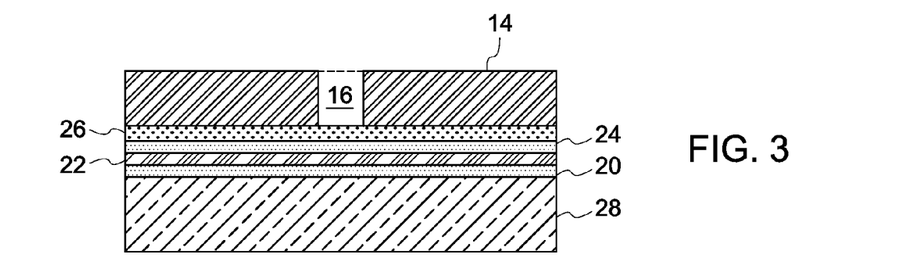
Figure 4:
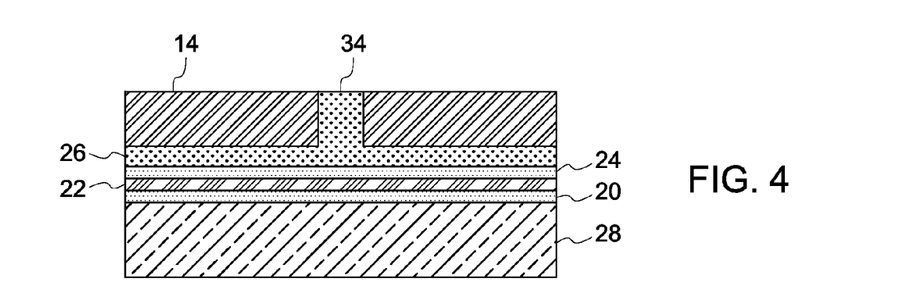
Figure 5:
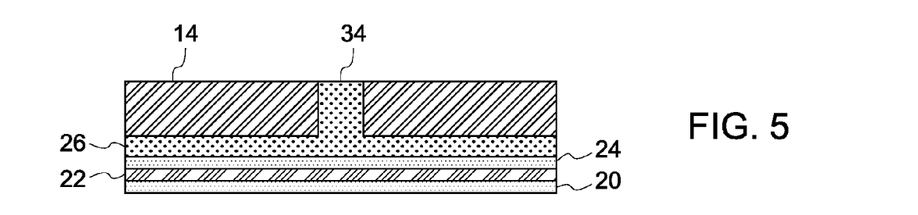

Further, as illustrated in FIG. 3, the wafer 14 with the via 16 is bonded to the metal coated substrate 28. In this exemplary embodiment, the wafer or thermally blocking layer 14 is bonded to an exposed surface of the metal layer 26 using an anodic bond. However, a variety of other bonding techniques may be employed. In FIG. 4, the via 16 in the wafer 14 is electroplated using a metal 34 to form an electrical feedthrough. In this exemplary embodiment, the metal 34 includes copper. It should be noted that, although not illustrated, wafer 14 may include a plurality of electroplated vias to form the electrical feedthroughs. Further, as illustrated in FIG. 5, the substrate 28 is removed to form the smooth electrode. In this exemplary embodiment, the substrate 28 is etched away exposing metal layer 20, which in turn forms the smooth surface of the electrode. In certain embodiments, the surface roughness of the metal layer 20 is substantially the same as the surface roughness of the substrate 28. In one embodiment, the average surface roughness of the electrode formed using the above process is less than about 5 A.

Figure 6:
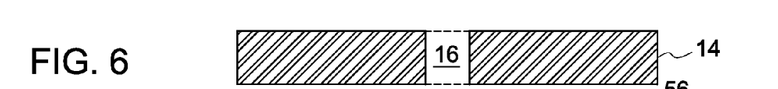
FIGS. 6-19 illustrate an exemplary method for fabricating a device such as thermotunneling device having a smooth electrode
Figures 7, 8:
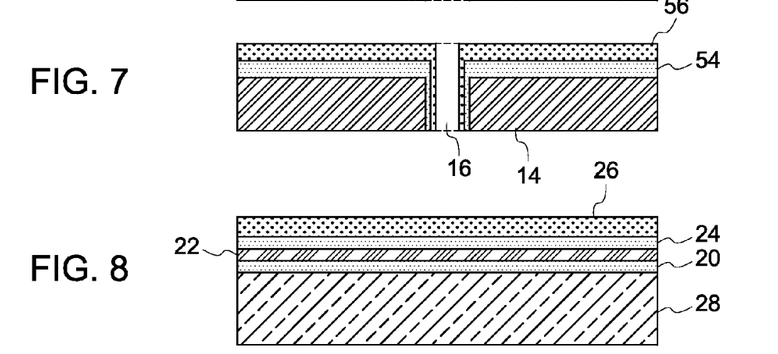

FIGS. 6-19 illustrate an exemplary method for fabricating a device such as thermotunneling device having a smooth electrode such as that illustrated in FIG. 5. As with the embodiment of FIG. 1, the wafer 14 having via 16 is provided in FIG. 6. In FIG. 7, metal layers such as represented by reference numerals 54 and 56 are deposited on a top surface of the wafer 14. It should be noted that a variety of deposition techniques may be employed to deposit the metal layers 54 and 56 on the wafer 14. In the illustrated embodiment, the metal layers 54 and 56 are sputtered on the top surface of the wafer 14. In this exemplary embodiment, the wafer 14 represents a thermally blocking layer. In this exemplary embodiment, the metal layers 54 and 56 include tungsten and copper respectively. However, other suitable metals such as platinum, molybdenum, titanium, nickel, tantalum, aluminum, chromium, cesium and gold may be employed. Again, a greater or a lesser number of layers may be deposited on the wafer 14. In this exemplary embodiment, the metal layer 56 (copper in this case) is utilized to facilitate bonding with a similar metal layer deposited on a substrate that will be described below with reference to FIG. 9. Further, the metal layer 54 (tungsten in this case) facilitates the bonding of the copper layer 56 to the wafer 14. In the illustrated embodiment, thicknesses of the tungsten and copper layers are about 300 A and 500 A respectively.

Further, as with embodiment of FIG. 2, the plurality of metals 20, 22, 24 and 26 are sputtered on the top surface of the substrate 28 in FIG. 8. In this exemplary embodiment, the metals 20 and 22 may include tungsten and platinum respectively. Further, the metals 24 and 26 may include tungsten and copper respectively. In the illustrated embodiment, thicknesses of the tungsten and platinum layers 20 and 22 are about 300 A and 1000 A respectively. Further, the thicknesses of the tungsten and copper layers 24 and 26 are about 300 A and 1.5 microns (e.g., 1500 A) respectively.

Figures 9, 10:
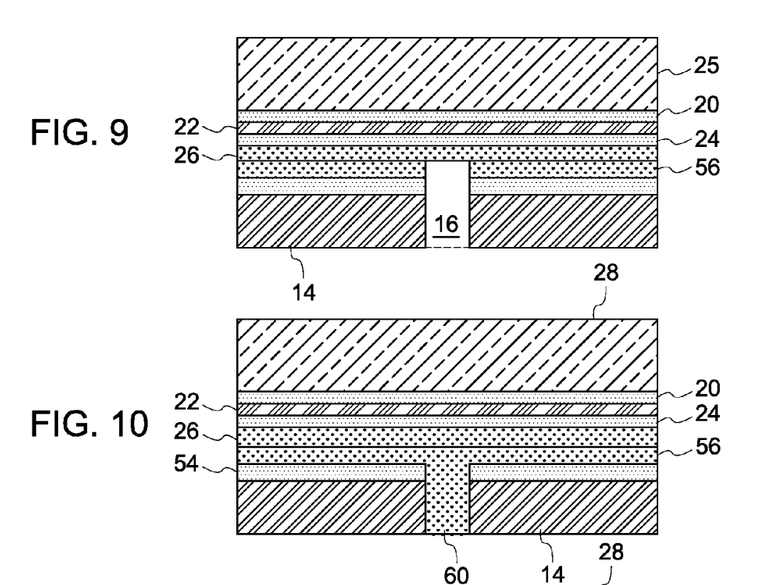
Figure 11:
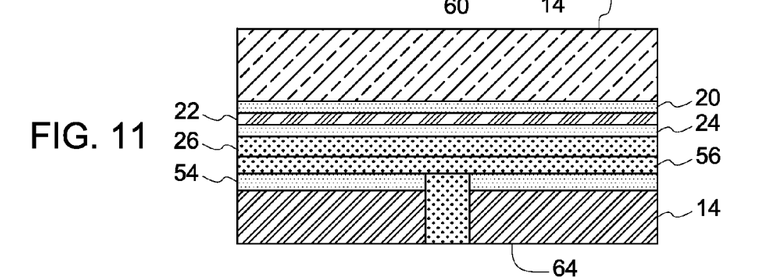

In FIG. 9, structures formed in FIGS. 7 and 8 are bonded together. In this embodiment, the bonding is performed such that the copper layer 26 deposited on the substrate 28 is bonded to the copper layer 56 deposited on the wafer 14. In certain other embodiments, other metal layers may be employed in the structures 18 and 52 to facilitate the bonding. For example, the bonding of the structures may include bonding of a gold layer to a gold layer, or of a solder layer to a gold layer, or a solder layer to a nickel layer, or an indium layer to a gold layer. Further, in FIG. 10, the via 16 is electroplated using a metal 60 to form an electrical feedthrough. In this exemplary embodiment, the metal 60 includes copper. Further, the surface of the electrical feedthrough is planarized using CMP as illustrated in FIG. 11. In this exemplary embodiment, a bottom surface 64 of the wafer 14 forms an upper electrode of the device.

Figure 12:
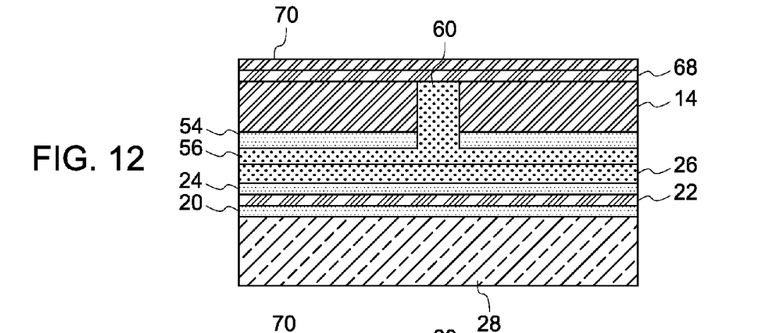
Figure 13:
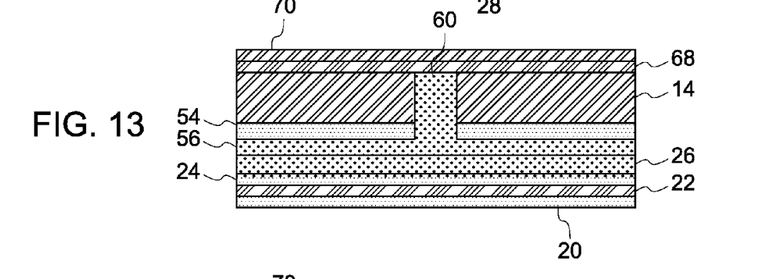

In FIG. 12, a metal layer 68 is deposited on the top surface of the wafer 14. Further, a layer of a nitride 70 is deposited on a top surface of the metal layer 68. In certain embodiments, a plurality of metal layers may be deposited on the top surface of the wafer 14. In one exemplary embodiment, the metal layer 68 includes tungsten, nickel and gold. Further, in this embodiment, the thicknesses of the tungsten, nickel and gold area about 300 A, about 5 K and about 1 K respectively. Further, a thickness of the nitride layer 70 is about 2000 A. Further, in FIG. 13, the substrate 28 is removed. In this exemplary embodiment, the substrate 28 is etched using a KOH etch. However, other suitable etching or wafer removal techniques may be employed. In certain exemplary embodiments, tetramethylammonium hydroxide (TMAH) etching may be employed to remove the substrate 28.

Figures 14, 15:
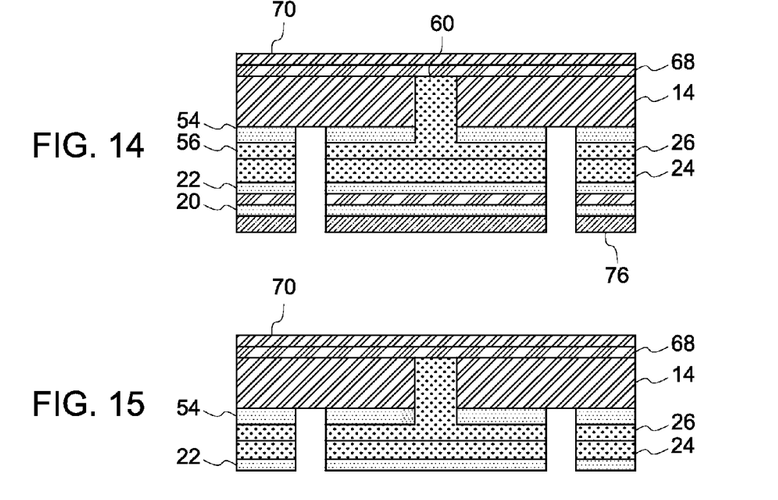

As illustrated in FIG. 14, photoresist 76 is employed to pattern the metal layers 20, 22, 24, 26 and 54. The metal layers may then be etched away using a mix of wet or dry etch processes to form a patterned electrode. In this exemplary embodiment, the tungsten layer 20 is wet etched using hydrogen peroxide ($H_2O_2$) solution and the platinum layer 22 is dry etched. Further, the copper and tungsten layers 24 and 26 are wet etched using the hydrogen peroxide solution. Further, the photoresist 76 is removed and the tungsten layer 20 is wet etched using hydrogen peroxide ($H_2O_2$) solution to form the structure illustrated in FIG. 15.

Figure 16:
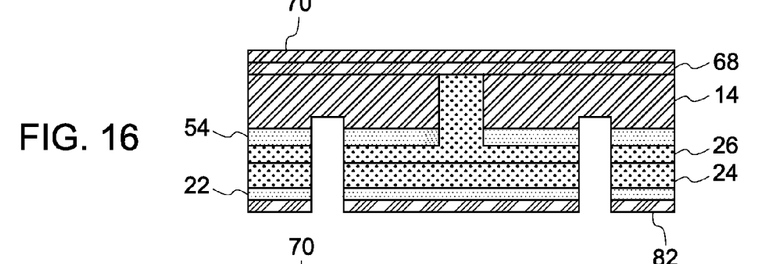
Figure 17:
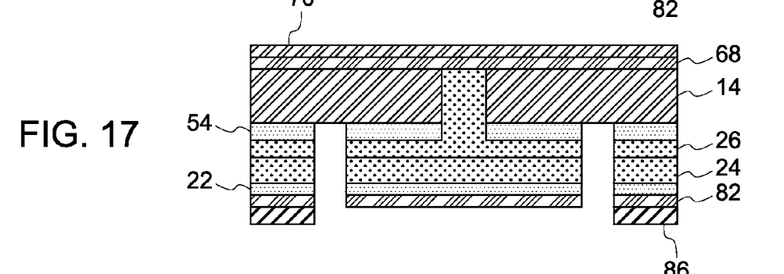

In FIG. 16, a layer of titanium 82 is deposited and patterned on a bottom surface of the tungsten layer 22. In this exemplary embodiment, a thickness of the titanium layer 82 is about 300 A. Further the patterned layer 82 is oxidized. As illustrated in FIG. 17, an oxide layer 86 is deposited on a bottom surface of the titanium layer 82 and is patterned and etched to form oxide posts. In this exemplary embodiment, the oxide layer 86 is deposited using plasma-enhanced chemical vapor deposition (PECVD) technique. However, other suitable deposition techniques may be employed. In the illustrated embodiment, the thickness of the oxide layer 86 is about 1100 A. In certain embodiments, a plurality of oxide posts may be fabricated to facilitate the bonding of the electrodes in the device and to substantially prevent the electrodes from bowing as well as maintaining the gap separation. In this exemplary embodiment, the titanium layer 82 forms a top electrode of the thermotunneling device. In this exemplary embodiment, the top electrode replicates the smoothness of the substrate 28 to form the smooth electrode.

Figure 18:
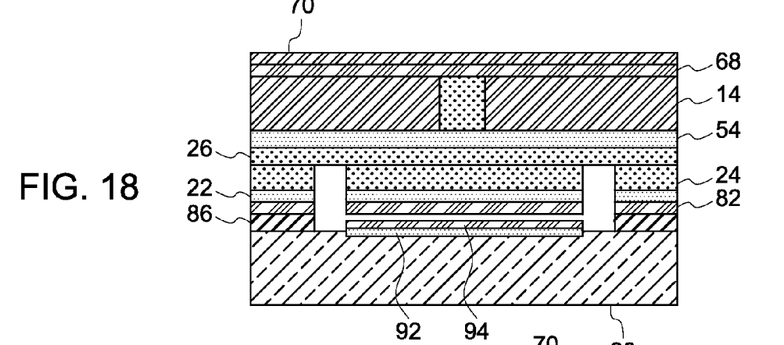
Figure 19:
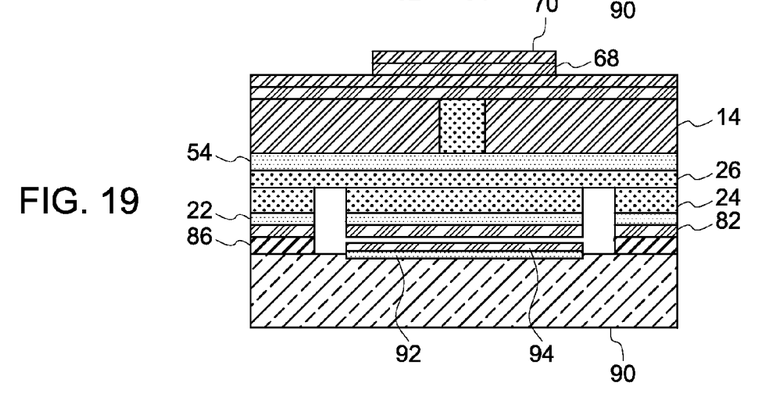

The structure formed in FIG. 17, is bonded to a bottom wafer 90, as illustrated in FIG. 18. In the illustrated embodiment, the bottom wafer 90 includes a patterned electrode formed of metal layers such as represented by reference numerals 92 and 94. Examples of such metal layers include titanium, platinum and so forth. Further, in FIG. 19, the nitride layer 70 is blanket etched and the metal layer 68 is patterned and etched to form the thermotunneling device. In this exemplary embodiment, the layers 82 and 94 form the electrodes to facilitate the tunneling of electrons in the thermotunneling device.

Figure 20:
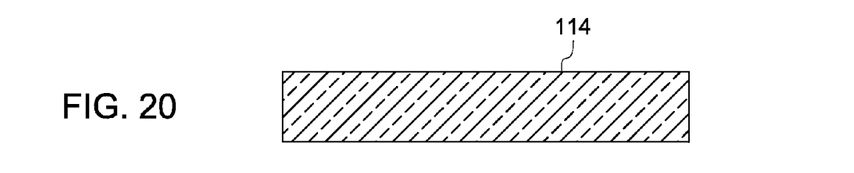
FIGS. 20-35 illustrate another exemplary method for fabricating a device such as thermotunneling device having a smooth electrode.
Figure 21:
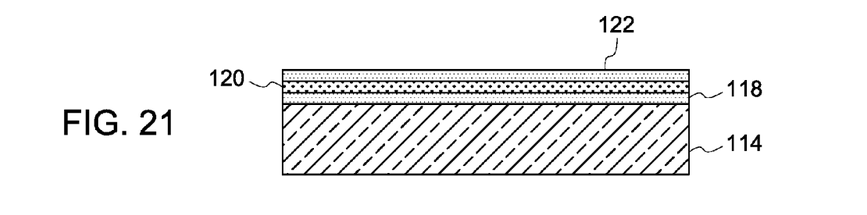

FIGS. 20-35 illustrate another exemplary method for fabricating a device such as thermotunneling device having a smooth electrode. In FIG. 20, a wafer 114 is provided. In this exemplary embodiment, the wafer 114 includes a silicon, or pyrex, or quartz, or mica, or sapphire. Further, as illustrated in FIG. 21, a plurality of metal layers such as represented by reference numerals 118, 120 and 122 are deposited on a top surface of the wafer 114. In this exemplary embodiment, the layers 118 and 122 include titanium and the layer 120 includes copper. In the illustrated embodiment, the titanium layers 118 and 122 have a thickness of about 1000 A and 2000 A respectively. Further, the copper layer 120 has thickness of about 2 um.

Figure 22:
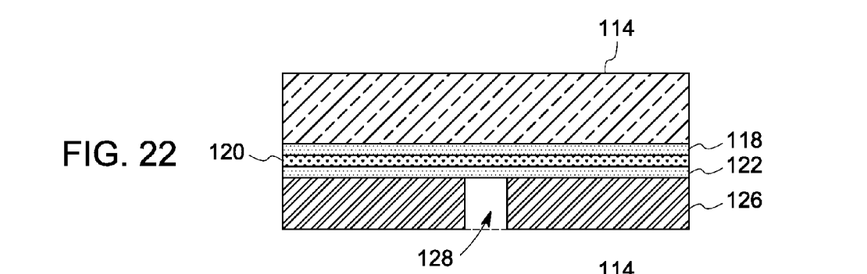
Figure 23:
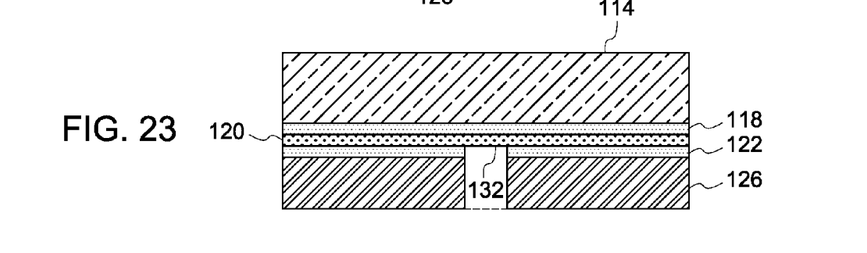

In FIG. 22, a thermal blocking layer 126 having vias such as represented by reference numeral 128 is bonded to an exposed surface of the titanium layer 122. In this exemplary embodiment, the thermal blocking layer 126 is bonded to the titanium layer 122 using an anodic bond. However, other suitable bonding techniques may be employed. Further, in FIG. 23, the titanium layer 122 is etched from area 132 within the via 128.

Figure 24:
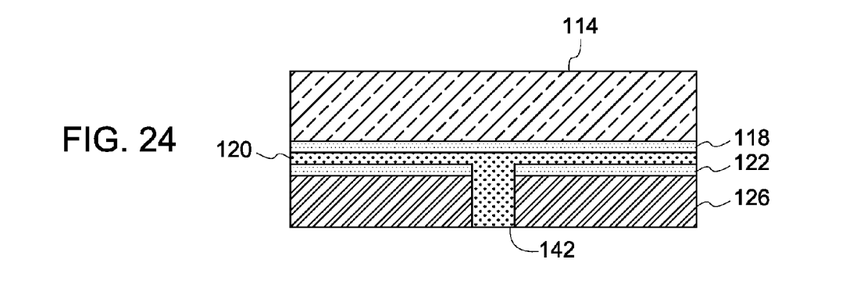
Figure 25:
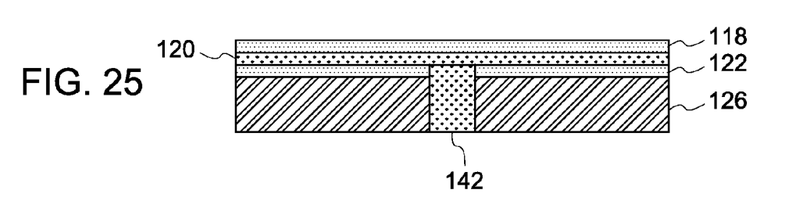
Figure 26:
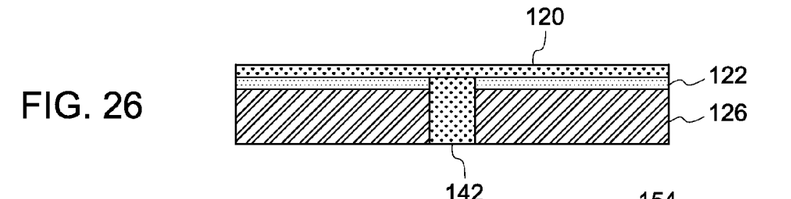
Figure 27:
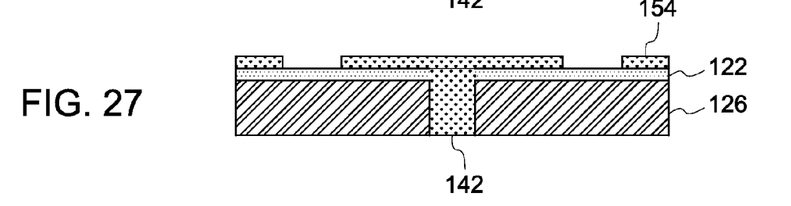
Figure 28:
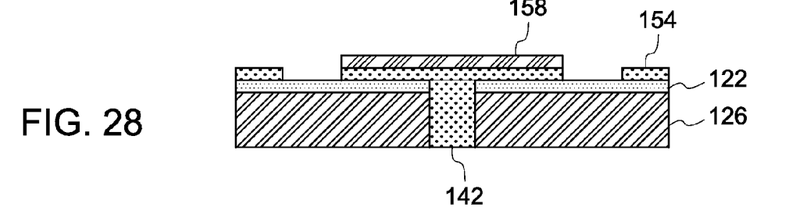
Figure 29:
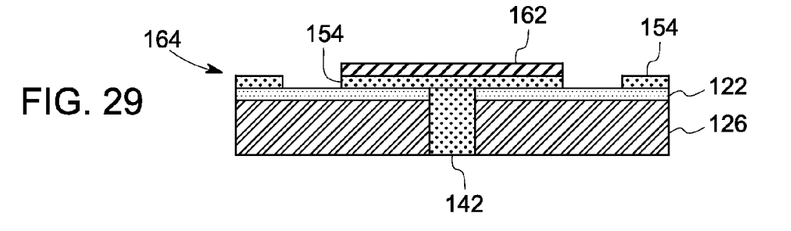

In FIG. 24, the via 128 in the wafer 14 is electroplated using a metal 142 to form an electrical feedthrough. In this exemplary embodiment, the metal 142 includes copper. Further, the wafer 114 is removed as illustrated in FIG. 25. In this exemplary embodiment, the wafer 114 is removed using KOH etch however other etching methods may be used. In the illustrated embodiment, the titanium layer 118 is removed in FIG. 26. Further, the copper layer 120 is patterned to form patterned electrode 154 as illustrated in FIG. 27. In FIG. 28, a metal layer 158 is deposited and patterned on a top surface of the patterned electrode 154. In this exemplary embodiment, the metal layer 158 includes titanium. Further, as illustrated in FIG. 29, the titanium layer 158 is oxidized to form titanium oxide layer 162. In this exemplary embodiment, structure 164 forms a top portion of the thermotunneling device. The fabrication of a bottom portion of the thermotunneling device will be described below.

Figure 30:
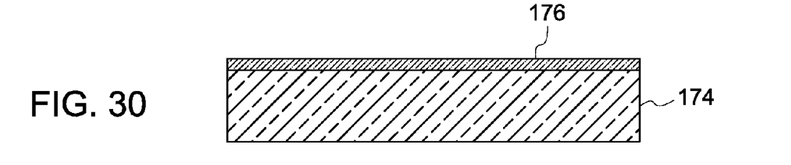
Figure 31:
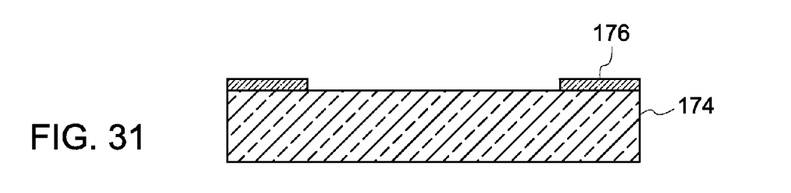
Figure 32:
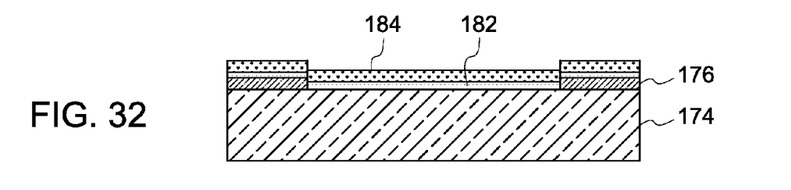
Figure 33:
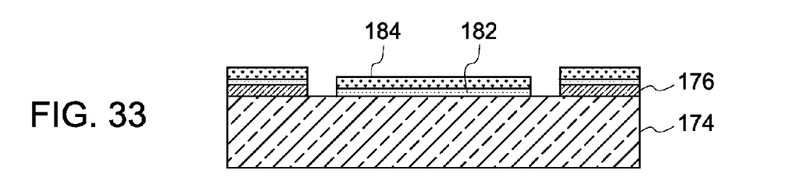
Figure 34:
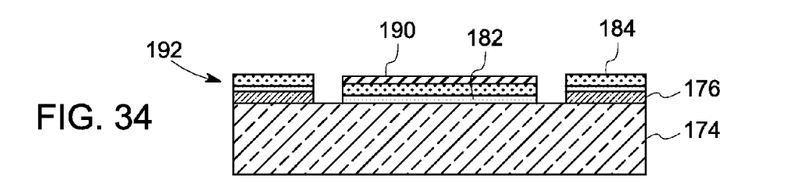
Figure 35:
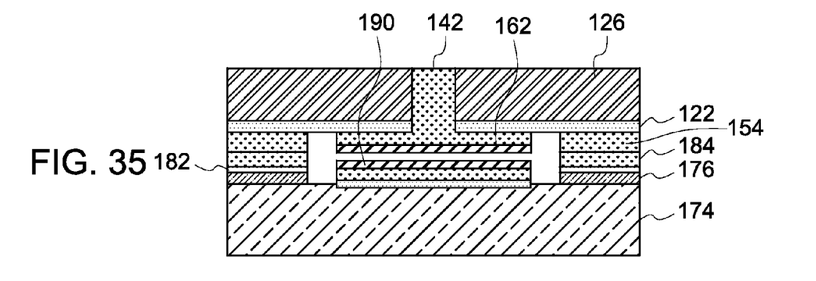
Figure 36:
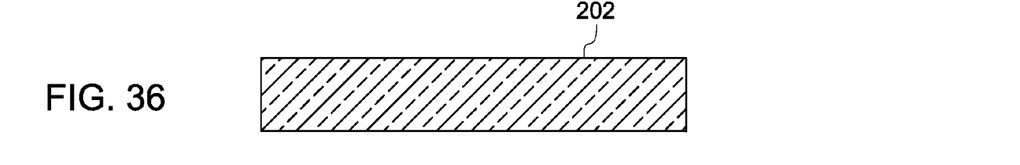
FIGS. 36-44 illustrate another exemplary method for fabricating a smooth electrode.

As illustrated, in FIG. 30, a wafer 174 is provided. In this embodiment, the wafer 174 comprises silicon. Further, a layer of thermal oxide 176 is deposited on a top surface of the wafer 174. Examples of the thermal oxide layer 176 include thermal CVD, PECVD. In this exemplary embodiment, thickness of the thermal oxide layer 176 is about 10 nanometers. In FIG. 31, the thermal oxide layer 176 is patterned. Further, metal layers such as represented by reference numerals 182 and 184 are deposited on a top surface of the patterned thermal oxide 176, as illustrated in FIG. 32. In this exemplary embodiment, the metal layers 182 and 184 include titanium and copper respectively. Further, the titanium and copper layers 182 and 184 are patterned as illustrated in FIG. 33. In FIG. 34, a layer of titanium is deposited and converted to titanium oxide layer 190 to form the bottom portion 192 of the thermotunneling device. Further, as illustrated in FIG. 35, the structures 164 and 192 are bonded to form the thermotunneling device. In this exemplary embodiment, the copper layers 154 and 184 are bonded together to form the device. As illustrated, the titanium, oxide layers 162 and 190 form the smooth electrodes of the thermotunneling device. In certain embodiments, the average surface roughness of the electrodes 162 and 190 is less than about 5 A.

Figure 37:
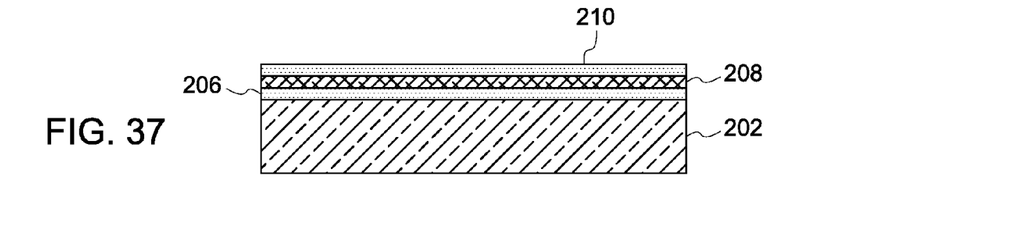

FIGS. 36-44 illustrate another exemplary method for fabricating a smooth electrode. In this exemplary embodiment, a wafer 202 is provided in FIG. 36. Further, metal layers such as represented by reference numerals 206, 208 and 210 are deposited on a top surface of the wafer 202 as illustrated in FIG. 37. In this exemplary embodiment, the metal layers 206 and 210 include titanium and the layer 208 includes gold. Further, the thickness of each of the titanium layers 206 and 210 is about 1000 A and the thickness of the gold layer 208 is about 2 um.

Figure 38:
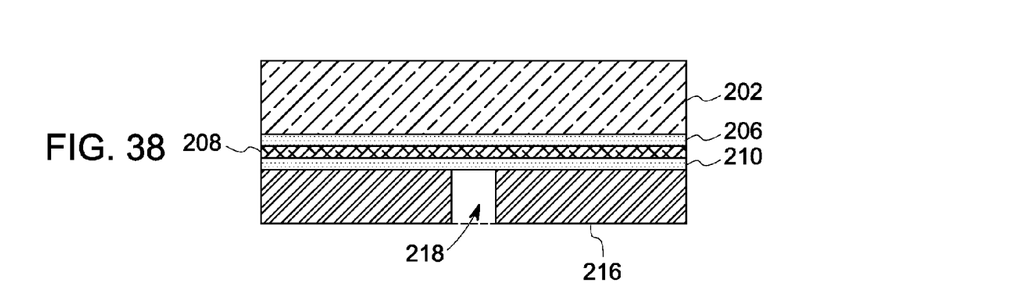
Figure 39:
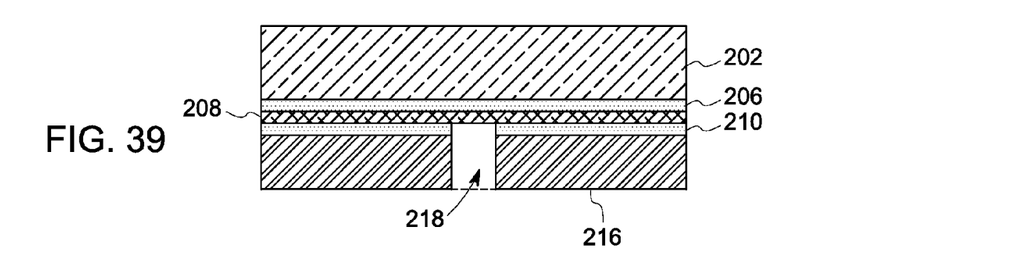
Figure 40:
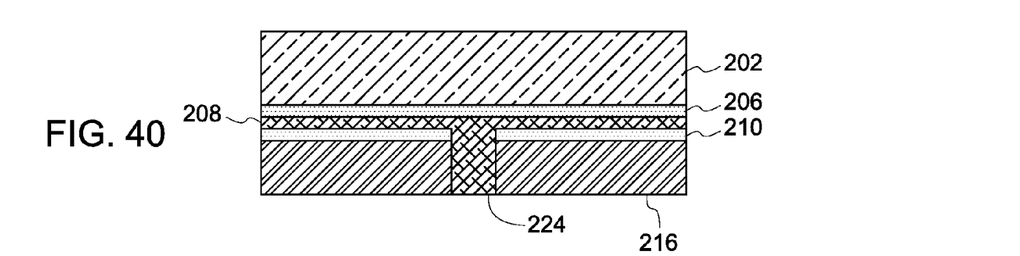

In FIG. 38, a thermal blocking layer 216 having vias such as represented by reference numeral 218 is bonded to an exposed surface of the metal layer 210. In this exemplary embodiment, the thermal blocking layer 216 is bonded to the titanium layer 210 through an anodic bond. In this exemplary embodiment, the bonding is performed at a temperature of about 380° C. and by applying a voltage of about 1500 V. Further, the bonding is followed by annealing at a temperature of about 400° C. In FIG. 39, titanium oxide 222 formed within the via 218 is etched. Further, the via 218 is electroplated using a metal 224, as represented in FIG. 40. In this exemplary embodiment, the metal 224 includes gold.

Figures 41, 42:
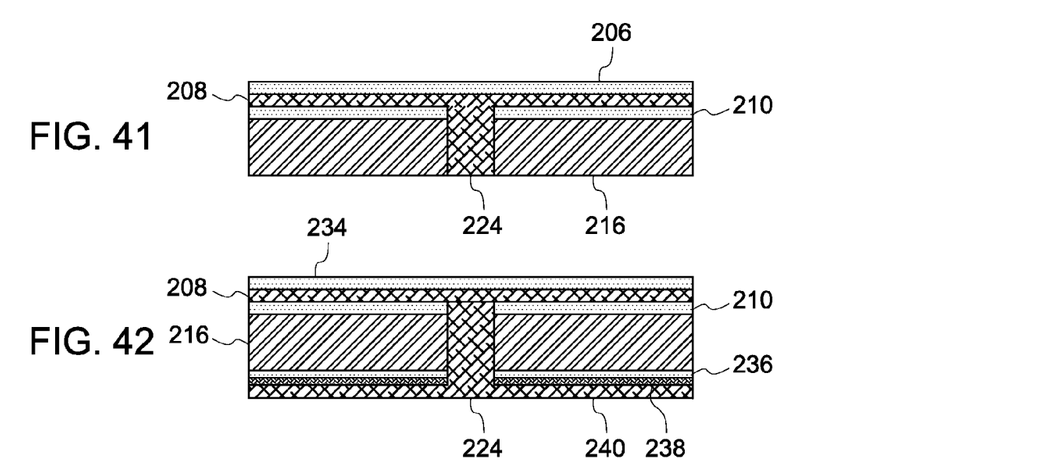
Figures 43, 44:
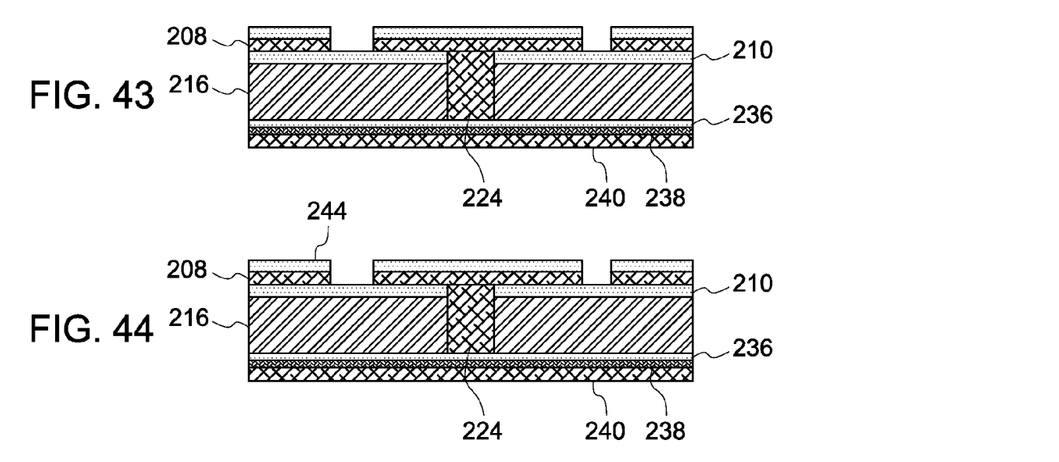

In FIG. 41, the silicon wafer 216 is removed. In certain embodiments, silicon is grinded to achieve a thickness of about 100 um. Further, remaining silicon and the titanium layer 206 is removed using KOH etch. Further, as illustrated in FIG. 42, a thin titanium layer 234 is deposited on a top surface of the gold layer 208. In the illustrated embodiment, a thickness of the titanium layer is about 1000A. In addition, metal layers such as represented by reference numerals 236, 238 and 240 are deposited on an exposed surface of the wafer 216. In this exemplary embodiment, the metal layers 236, 238 and 240 include titanium, nickel and gold. Further, in FIG. 43, the titanium and gold layers 208 and 210 are etched and patterned. In addition, the etched titanium layer is oxidized to form titanium oxide 244 to form the smooth electrode, as illustrated in FIG. 44.

Figure 45:
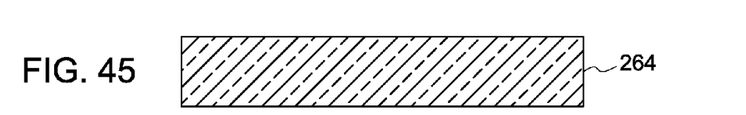
FIGS. 45-50 illustrate an exemplary method for fabricating a textured electrode.
Figure 46:
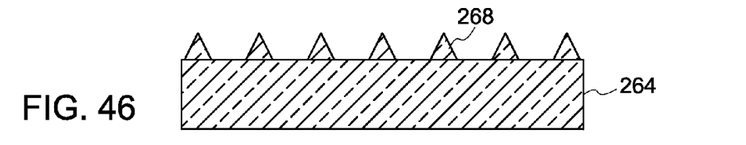

FIGS. 1-44 described above illustrate exemplary processes for forming smooth electrodes. FIGS. 45-50 illustrate an exemplary process for fabricating a textured electrode. In FIG. 45, a sacrificial substrate 264 is provided. In this exemplary embodiment, the substrate 264 includes silicon, or pyrex, or quartz, or mica, or sapphire. In this embodiment, a surface roughness of the substrate 264 is about 10 nm. Further, in FIG. 46, a top surface of the substrate 264 is patterned to include nanoscale features such as represented by reference numeral 268. Examples of such features include independent or repeating sawtooth, square, or rounded features.

Figure 47:
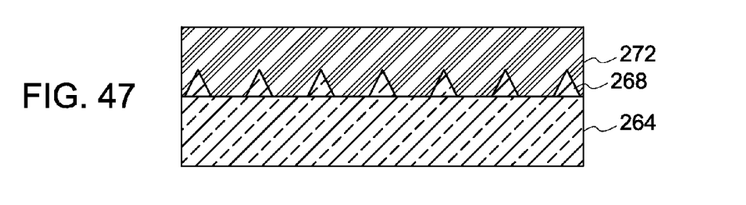
Figure 48:
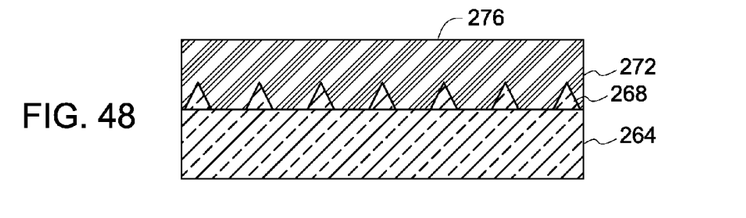
Figure 49:
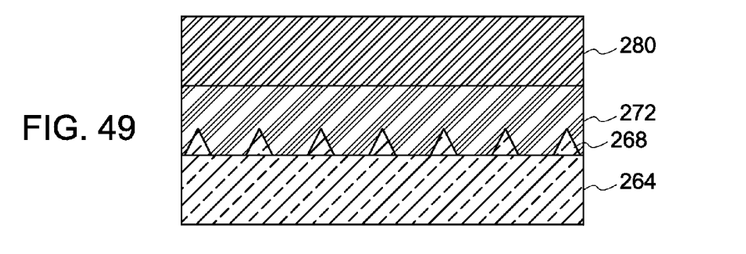
Figure 50:
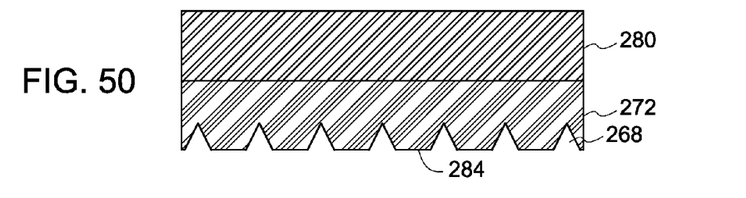

In FIG. 47, a metal layer 272 is deposited on a top surface of the substrate 264. Examples of the metal layer 272 include tungsten, platinum, copper, molybdenum, titanium, nickel, tantalum, aluminum, chromium, cesium and gold. Further, as illustrated in FIG. 48, a top surface 276 of the metal layer 272 is planarized. In FIG. 49, a wafer 280 is bonded to the metal layer 272. In this exemplary embodiment, the wafer 280 represents a thermally blocking layer. Examples of the wafer 280 include glass, or silicon dioxide, or sapphire, or silicon carbide, or a combination thereof. In this exemplary embodiment, the thermal blocking layer 280 includes borosilicate glass, such as PYREX having a thermal conductivity of about 1 W/m-K. Further, in FIG. 50, the substrate 264 is removed to form the textured electrode. In this exemplary embodiment, the substrate 264 is etched away exposing metal layer 272 having features 268, which in turn forms the textured surface 284 of the electrode.

The various aspects of the techniques described above find utility in a variety of devices such as heat transfer devices, switch contacts and micro-electro-mechanical systems. In particular, the techniques described above facilitate fabrication of smooth electrodes having substantially low surface roughness for applications that require relatively thick metal electrodes. For example, the heat transfer devices having smooth electrodes fabricated using the above techniques can be used for a variety of systems like heating/cooling systems, such as refrigeration, air conditioning, electronics cooling, industrial temperature control, and so forth.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of fabricating an electrode, comprising:
providing a wafer, wherein the wafer comprises bonding a thermally blocking layer including one or more vias through the thermal blocking layer;
providing a substrate;
depositing a plurality of layers having electrically and thermally conductive materials such as metal on a top surface of the substrate; then
bonding the wafer to the metal coated substrate; then
electroplating one or more vias in the wafer using a metal to form an electrical feedthroughs through a thermal blocking layer; and then;
removing the substrate to form a smooth electrode.

2. The method of claim 1, wherein a surface roughness of the smooth electrode is substantially equal to the surface roughness of the substrate.

3. The method of claim 2, wherein a thickness of metal coated substrate is greater than about 1 micron and wherein an average surface roughness of the smooth electrode is less than about 10 nm.

4. A method of fabricating an electrode, comprising:
providing a sacrificial substrate;
patterning a top surface of the sacrificial substrate to include nanoscale features; then
depositing a metal layer on the top surface of the sacrificial substrate including the nanoscale features;
planarizing a top surface of the metal layer; then bonding a wafer to the metal layer, wherein the wafer comprises a thermally blocking layer; and then;
removing the sacrificial substrate to form a textured electrode by etching.

5. The method of claim 4, wherein the thermally blocking layer comprises one or more vias through the thermal blocking layer.

6. The method of claim 4, further comprising electroplating the one or more vias with a metal to form the electrical feedthroughs through the thermal blocking layer.

* * * * *